(12) United States Patent
Takita

(10) Patent No.: US 12,411,172 B2
(45) Date of Patent: Sep. 9, 2025

(54) TEST SYSTEM

(71) Applicant: SINTOKOGIO, LTD., Nagoya (JP)

(72) Inventor: Nobuyuki Takita, Nagoya (JP)

(73) Assignee: SINTOKOGIO, LTD., Aichi (JP)

( * ) Notice: Subject to any disclaimer, the term of this patent is extended or adjusted under 35 U.S.C. 154(b) by 0 days.

(21) Appl. No.: 18/438,993

(22) Filed: Feb. 12, 2024

(65) Prior Publication Data

US 2024/0329131 A1 Oct. 3, 2024

(30) Foreign Application Priority Data

Mar. 29, 2023 (JP) .................. 2023-054289

(51) Int. Cl.
  *G01R 31/317* (2006.01)
(52) U.S. Cl.
  CPC . *G01R 31/31726* (2013.01); *G01R 31/31724* (2013.01)
(58) Field of Classification Search
  None
  See application file for complete search history.

(56) References Cited

U.S. PATENT DOCUMENTS

| | | | | |
|---|---|---|---|---|
| 8,726,064 | B2* | 5/2014 | Bennett | G06F 13/4243 |
| | | | | 710/316 |
| 2002/0048270 | A1* | 4/2002 | Allen, Jr. | H04L 49/351 |
| | | | | 370/392 |
| 2004/0066615 | A1* | 4/2004 | Pavesi | H05K 1/14 |
| | | | | 361/679.55 |
| 2005/0232204 | A1* | 10/2005 | Bass | G06F 13/4022 |
| | | | | 370/335 |
| 2010/0228508 | A1* | 9/2010 | Smith | G01R 13/0254 |
| | | | | 702/68 |
| 2014/0100822 | A1* | 4/2014 | Hiltner | G06F 17/15 |
| | | | | 702/189 |
| 2020/0256893 | A1 | 8/2020 | Knierim et al. | |
| 2021/0263076 | A1 | 8/2021 | Knierim et al. | |
| 2021/0325432 | A1* | 10/2021 | Jensen | G01R 13/0254 |
| 2022/0357237 | A1* | 11/2022 | Tan | G01M 11/3145 |
| 2023/0213556 | A1* | 7/2023 | Zivny | G01R 13/26 |
| | | | | 315/383 |

FOREIGN PATENT DOCUMENTS

JP 2022-519763 A 3/2022

OTHER PUBLICATIONS

F. Marini et al., "FPGA Implementation of an NCO Based CDR for the JUNO Front-End Electronics," in IEEE Transactions on Nuclear Science, vol. 68, No. 8, pp. 1952-1960, Aug. 2021, (Year: 2021).*

* cited by examiner

*Primary Examiner* — Daniel F. McMahon

(74) *Attorney, Agent, or Firm* — Harness, Dickey & Pierce, P.L.C.

(57) ABSTRACT

Provided is a system for use in synchronizing a plurality of connected units.
The system includes a plurality of backplanes connected to at least one unit used in a characteristic test of a device and an integrated controller that controls the at least one unit. The plurality of backplanes are connected to each other in a tree structure.

5 Claims, 7 Drawing Sheets

TEST SYSTEM

This Nonprovisional application claims priority under 35 U.S.C. § 119 on Patent Application No. 2023-054289 filed in Japan on Mar. 29, 2023, the entire contents of which are hereby incorporated by reference.

TECHNICAL FIELD

The present disclosure relates to a test system.

BACKGROUND ART

Conventionally, a method of daisy-chaining a plurality of units is known as a method of synchronizing a plurality of units (for example, Patent Literature 1).

CITATION LIST

Patent Literature

[Patent Literature 1]
 Published Japanese Translation of PCT International Application, Tokuhyo, No. 2022-519763

SUMMARY OF INVENTION

Technical Problem

However, in a daisy-chain, the signal delay increases in proportion to the number of units connected.

It is an object of an aspect of the present disclosure to reduce an increase in signal delay.

Solution to Problem

In order to attain the object, a test system in accordance with an aspect of the present disclosure includes: a plurality of backplanes to which units used in a characteristic test of a device are connected such that at least one unit is connected to each of the plurality of backplanes; and an integrated controller that controls the at least one unit, the plurality of backplanes being connected to each other in a tree structure.

Advantageous Effects of Invention

According to an aspect of the present disclosure, it is possible to reduce an increase in signal delay.

DESCRIPTION OF EMBODIMENTS

The following description will discuss an embodiment of the present disclosure in detail. In description of the drawings, portions identical to each other will be assigned the same reference sign, and descriptions thereon will not be repeated.

(Example of Configuration of Test System)

Figure 1:
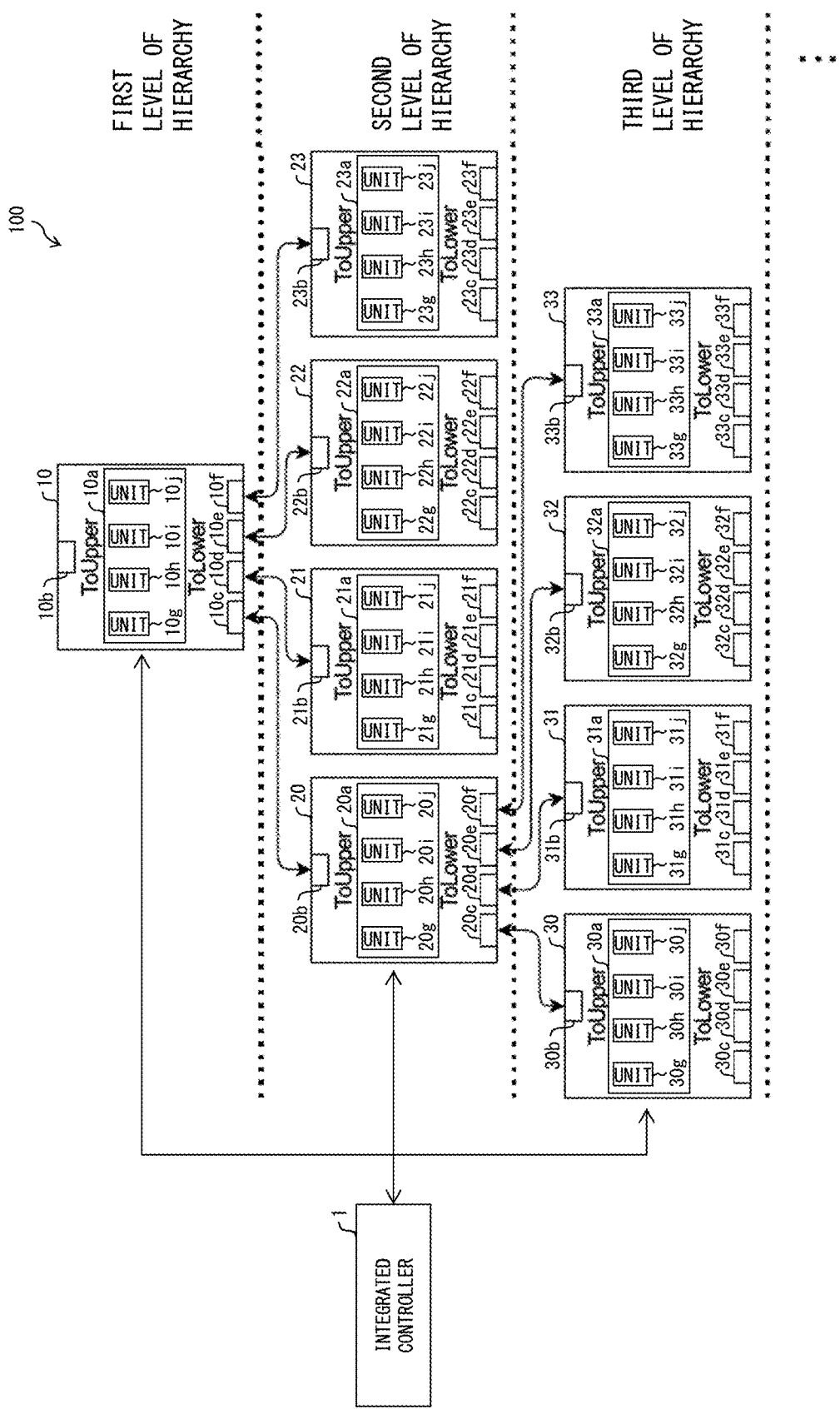
FIG. 1 is a view schematically illustrating a configuration of an example of a test system in accordance with an embodiment of the present disclosure.

An example of a configuration of a test system 100 in accordance with the present embodiment will be described with reference to FIG. 1. FIG. 1 is a view schematically illustrating a configuration of an example of the test system 100.

As illustrated in FIG. 1, the test system 100 includes: backplanes 10, 20 through 23, and 30 through 33; a plurality of units 10g through 10j, 20g through 20j, . . . connected to internal buses 10a, 20a through 23a, and 30a through 33a of the respective backplanes; and an integrated controller 1 which controls the plurality of units 10g through 10j, 20g through 20j, . . . .

The backplanes 10, 20 through 23, and 30 through 33 each include a processor constituted by a memory and a CPU (not illustrated) and have functions related to input and output of various signals, control, arithmetic operation, and the like. Inside the respective backplanes, the internal buses 10a, 20a through 23a, and 30a through 33a are provided.

To the internal buses 10a, 20a through 23a, and 30a through 33a, a plurality of units 10g through 10j, 20g through 20j, 21g through 21j, 22g through 22j, 23g through 23j, 30g through 30j, 31g through 31j, 32g through 32j, and 33g through 33j are connected. FIG. 1 shows an example in which four units are connected to one internal bus. However, the number of units connected to one internal bus is not limited to four, and any number of units between 0 and n (n is a natural number) can be connected to one internal bus.

The units are used for a characteristic test of a device. An example of the device to be subjected to a characteristic test is a semiconductor device. Examples of the semiconductor device encompass a discrete semiconductor device such as a diode, a transistor, and a thyristor, and an integrated circuit (IC) into which such discrete semiconductor devices are integrated. Note, however, that the device subject to the characteristic test is not limited to a semiconductor device, but may be other devices.

The integrated controller 1 can be constituted by, for example, a microcomputer. As an example, the integrated controller 1 incorporates a processor constituted by a memory (not illustrated) and a central processing unit (CPU), and a program stored in the memory in advance is executed by the CPU to enable control of the units. Although details of the control will be described later, for example, the integrated controller 1 can determine an operation mode of each unit.

The integrated controller 1 is communicably connected to the units. The method of connection between the integrated controller 1 and the units is not particularly limited, and the integrated controller 1 can be connected to the units in a wired manner or a wireless manner. In a case where the integrated controller 1 is connected to the units in a wired manner, the integrated controller 1 is connected to the units via the backplanes.

The backplanes are communicably connected to each other. Although the method of connection between the backplanes is not particularly limited, for example, the backplanes are connected to each other via bus connectors of the internal buses.

In the present embodiment, as illustrated in FIG. 1, a tree structure is used as the method of connection between the backplanes. The tree structure is a structure in which, starting from a single root node, a plurality of child nodes are branched successively. In the tree structure, the root node is an uppermost node, and all of the child nodes below the root node each have a depth from the root node. Each node can have more than one child node but cannot have more than one parent node.

In the present embodiment, the backplanes are connected to one another with use of the tree structure described above. In the present embodiment, the first level of hierarchy corresponds to the uppermost node, the second level of hierarchy corresponds to a deeper node, the third level of hierarchy corresponds to an even deeper node, . . . and so on.

The four backplanes 20 to 23 are connected to the backplane 10 located at the first level of hierarchy. The four backplanes 20 through 23 are located at the second level of hierarchy.

Further, a plurality of backplanes are connected to each of the backplanes 20 through 23. Although FIG. 1, because of space limitations, illustrates an example in which only the backplane 20 has the four backplanes 30 through 33 connected thereto, but each of the backplanes 21 through 23 also has four backplanes connected thereto. The four backplanes 30 through 33 are located at the third level of hierarchy. To a single backplane at an upper level of hierarchy, four backplanes at a lower level of hierarchy are connected. The deeper the level of hierarchy, the greater the number of backplanes. Hereinafter, a backplane at an upper level of hierarchy may be referred to as an "upper backplane". A backplane at a lower level of hierarchy may be referred to as a "lower backplane". Although the present embodiment shows an example in which four lower backplanes are connected to one upper backplane, this is merely an example. The number of lower backplanes connected is not limited to four, and can be changed as appropriate.

The backplanes 10, 20 through 23, and 30 through 33 respectively include 1-channel ToUpper ports 10b, 20b through 23b, and 30b through 33b and 4-channel ToLower ports 10c through 10f, 20c through 20f, 21c through 21f, 22c through 22f, 23c through 23f, 30c through 30f, 31c through 31f, 32c through 32f, and 33c through 33f. These ports function as input/output ports for various signals.

A ToUpper port is a port on an upper hierarchy side and is closer to an upper backplane. A ToLower port is a port on a lower hierarchy side and is closer to a lower backplane.

A ToLower port of an upper backplane is connected to a ToUpper port of a lower backplane. Specifically, the ToLower port 10c is connected to the ToUpper port 20b. The ToLower port 10d is connected to the ToUpper port 21b. The ToLower port 10e is connected to the ToUpper port 22b. The ToLower port 10f is connected to the ToUpper port 23b.

Similarly, the ToLower port 20c is connected to the ToUpper port 30b. The ToLower port 20d is connected to the ToUpper port 31b. The ToLower port 20e is connected to the ToUpper port 32b. The ToLower port 20f is connected to the ToUpper port 33b.

Note that nothing is connected to the ToUpper port 10b of the backplane 10 located at the uppermost level of the tree structure.

Each backplane is categorized into four types in total according to two conditions: a role determined by a condition at the time when the power of the backplane is turned on; and an operation mode of a unit connected to the internal bus. The following describes "roll". "Role" includes two concepts: "root" and "child". For each backplane, a determination is made as to whether or not the backplane is to function as a "root backplane" or as a "child backplane", in accordance with a condition at the time when the power of the backplane is turned on.

The following discusses "root backplane" and "child backplane". A root backplane generates a synchronization signal for synchronizing units and transmits the generated synchronization signal to child backplanes through ToLower ports. The units connected to the internal bus of each backplane are synchronized with the synchronization signal inputted to the ToUpper port. The root backplane is located at the uppermost level of the tree structure, and thus there is only one root backplane. Thus, all of the backplanes other than the root backplane are child backplanes. In FIG. 1, the backplane 10 is a root backplane, and the backplanes 20 through 23 and 30 through 33 are child backplanes.

In the present embodiment, the direction in which a synchronization signal is transmitted is always fixed to an upper-to-lower direction. That is, a synchronization signal is transmitted in the following order: the first level of hierarchy, the second level of hierarchy, the third level of hierarchy. The period of a synchronization signal is not particularly limited, but will be described as 1 MHz in the present embodiment. Hereinafter, a synchronization signal will be referred to as "GSync signal".

Next, the following will discuss a condition at the time when the power of a backplane is turned on. The condition at the time when the power of a backplane is turned on is whether or not a GSync signal is inputted to the ToUpper port of the backplane at the time when the power of the backplane is turned on. In a case where a GSync signal is inputted to the ToUpper port of a backplane at the time when the power of the backplane is turned on, the backplane functions as a "child backplane" In a case where no GSync signal is inputted to the ToUpper port of a backplane at the time when the power of the backplane is turned on, the backplane functions as a "root backplane".

Next, the following will discuss an "operation mode of a unit connected to the internal bus of a backplane". In the present embodiment, an operation mode of a unit is categorized into two modes in accordance with the type of a characteristic test of a semiconductor device. The two modes are primary mode and secondary mode.

Each unit operates in either a primary mode or a secondary mode in accordance with a command of the integrated controller 1. Hereinafter, in a case where a unit operates in the primary mode, the unit may be referred to as a primary unit. In a case where a unit operates in the secondary mode, the unit may be referred to as a secondary unit. There is only one primary unit across all backplanes. As such, the units other than the primary unit are all secondary units.

In terms of the type of the characteristic test, in a case where, for example, the semiconductor device is an insulated gate bipolar transistor, the characteristic test can be a measurement test on collector leakage current, a measurement test on gate leakage current, a measurement test on gate threshold voltage, or the like.

In accordance with the type of the characteristic test, it is preset which unit is to operate in the primary mode and which unit is to operate in the secondary mode. The integrated controller 1 instructs each unit on the operation mode in which the unit is to operate, in accordance with the type of the characteristic test. A command from the integrated controller 1 is notified to each backplane, and an operation mode of each unit is determined. Each unit operates in the primary mode or the secondary mode in accordance with the instruction from the integrated controller 1.

As described above, each backplane is categorized into the following four types: (1) a backplane which is a root backplane and to the internal bus of which a primary unit operating in the primary mode is connected; (2) a backplane which is a root backplane and to the internal bus of which no primary unit is connected; (3) a backplane which is a child backplane and to the internal bus of which a primary unit is connected; and (4) a backplane which is a child backplane and to the internal bus of which no primary unit is connected.

In a case where a backplane falls under (1) or (3) above, the backplane operates in the primary mode. In a case where a backplane falls under (2) or (4) above, the backplane operates in the secondary mode. Hereinafter, in order to distinguish between an operation mode of a unit and an operation mode of a backplane, a primary mode and a secondary mode of a unit are referred to as a primary mode (U) and a secondary mode (U), respectively, and a primary mode and a secondary mode of a backplane are referred to as a primary mode (B) and a secondary mode (B), respectively.

A role determined at the time when the power of a backplane is turned on does not change while the power of the backplane is on. An operation mode, however, does change while the power of the backplane is on, in accordance with the type of the characteristic test. That is, the position of the primary unit and the positions of the secondary units dynamically change according to the type of the characteristic test.

(Examples of Operations in Primary Mode (U) and Secondary Mode (U))

Next, the following description will discuss examples of operations of a unit, that is, examples of operations in the primary mode (U) and the secondary mode (U). The description will be given with respect to two separate examples: an example of operation in normal times; and an example of operation in a case where an abnormality has occurred.

(Example of Operation in Normal Times)

Figure 2:
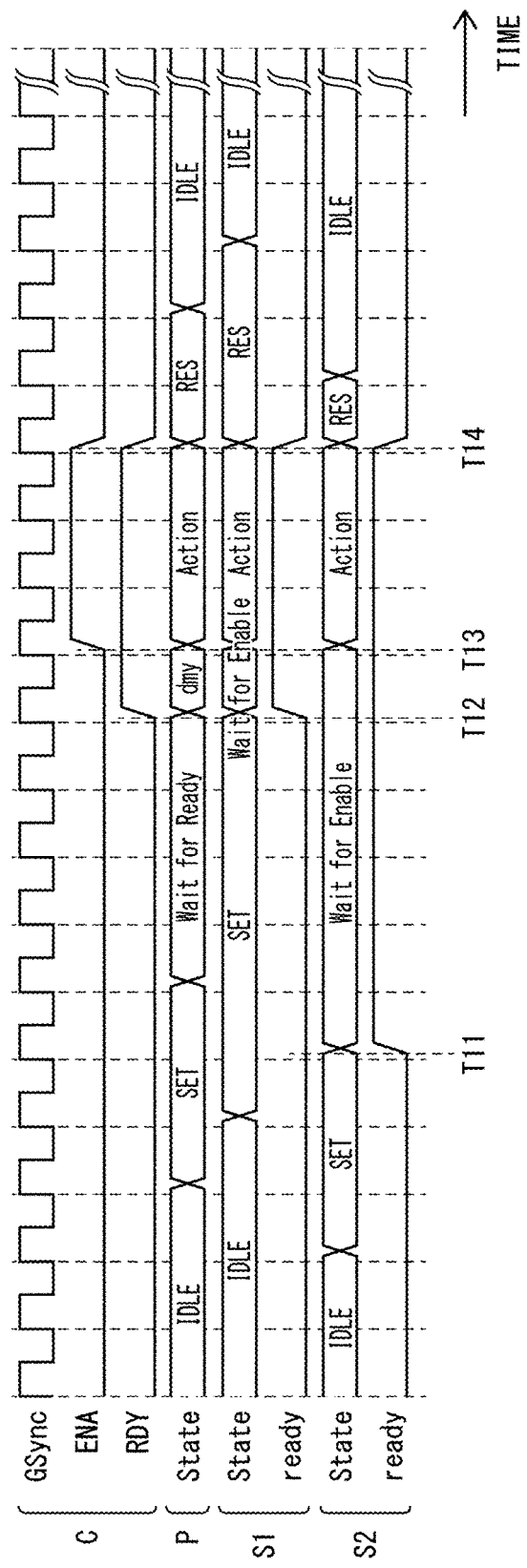
FIG. 2 is a timing chart illustrating an example of operations of a primary unit and secondary units in normal times.

Referring first to FIG. 2, an example of operation in normal times will be described. FIG. 2 is a timing chart illustrating an example of operations of a primary unit and secondary units in normal times.

The horizontal axis of FIG. 2 represents time. The following describes the vertical axis of FIG. 2. "C" in FIG. 2 shows respective signal lines of signals. The signals include a GSync signal indicated as "GSync", an ENA signal indicated as "ENA", and an RDY signal indicated as "RDY".

The GSync signal, as described above, is a synchronization signal for synchronizing the units.

The "ENA signal" is a signal which is outputted from the primary unit to the secondary units, and is a signal for permitting operation of the secondary unit. That is, the ENA signal is a signal which notifies all of the secondary units connected in the tree structure to start a step sequencer related to a measurement test. The fact that the backplanes are connected to one another in a tree structure means that the units are also connected to one another in a tree structure. Note, however, that in the case where a plurality of units are connected to the same internal bus, the plurality of units are connected in parallel rather than in a tree structure.

The ENA signal remains low until the RDY signal goes high. After confirming that the RDY signal has gone high, the primary unit turns the ENA signal high.

The "RDY signal" is a signal which is outputted from a secondary unit to the primary unit and which indicates that the secondary unit is ready to operate for a measurement test.

"P" represents a primary unit that operates in the primary mode (U). "S1" and "S2" each represent a secondary unit that operates in the secondary mode (U). Note that in FIG. 2, because of space limitations, the third and subsequent secondary units are omitted.

"IDLE" represents a waiting state in which a command from the integrated controller 1 is awaited. "SET" represents a state in which a command has been transmitted from the integrated controller 1 and an operation mode is set. In a period indicated with "SET", whether the unit operates in the primary mode (U) or the secondary mode (U) is set. Note that in a period indicates with "IDLE", it is not yet set whether the mode of the unit is the primary mode (U) or the secondary mode (U). The settings of the primary mode (U) and the secondary mode (U) are carried out in a state where the step sequencer is not operation.

After an operation mode is set, the secondary unit S2 outputs an RDY signal to the primary unit P (timing T11). Similarly, after an operation mode is set, the secondary unit S1 outputs an RDY signal to the primary unit P (timing T12). After receiving the RDY signals from the secondary units S1 and S2, that is, after confirming that the RDY signals are high, the primary unit P turns the ENA signal high and outputs the ENA signal to the secondary units S1 and S2 (timing T13).

In FIG. 2, "Wait for Ready" represents a state in which it is awaited that the RDY signal goes high. "Wait for Ready" in FIG. 2 represents a state in which it is awaited that the ENA signal goes high.

When turning the ENA signal high and outputting the ENA signal, the primary unit P stands by for a predetermined period represented as "dmy", and then turns the ENA signal high and outputs the ENA signal. The reason for inserting "dmy" is to increase accuracy of synchronization between the primary unit P and the secondary units S1 and S2. The period of "dmy" can be set up to approximately 100 cycles of the GSync signal. Note that the insertion of "dmy" is not mandatory.

At the timing T13, the ENA signal goes high. The primary unit P as well as the secondary units S1 and S2 which have received the ENA signal at a high level start the characteristic test. More specifically, the secondary units S1 and S2 start an operation from the next synchronization timing after the rise of the ENA signal. According to the present embodiment, since the units are connected to one another in a tree structure, the signal delay is reduced, and it is thus possible to improve accuracy of synchronization. Thus, the characteristic test can be efficiently carried out. In FIG. 2, "Action" represents a state in which the characteristic test is being carried out. After the characteristic test is finished, the primary unit P turns the ENA signal low, and the secondary units S1 and S2 each turn the RDY signal low (timing T14). After the characteristic test is finished, measurement result processing and the like are carried out, and preparation for a next characteristic test is started. In FIG. 2, "RES"

represents a state in which measurement result processing and the like are being carried out.

(Example of Operation in Case where Abnormality Occurs in Primary Unit P)

Figure 3:
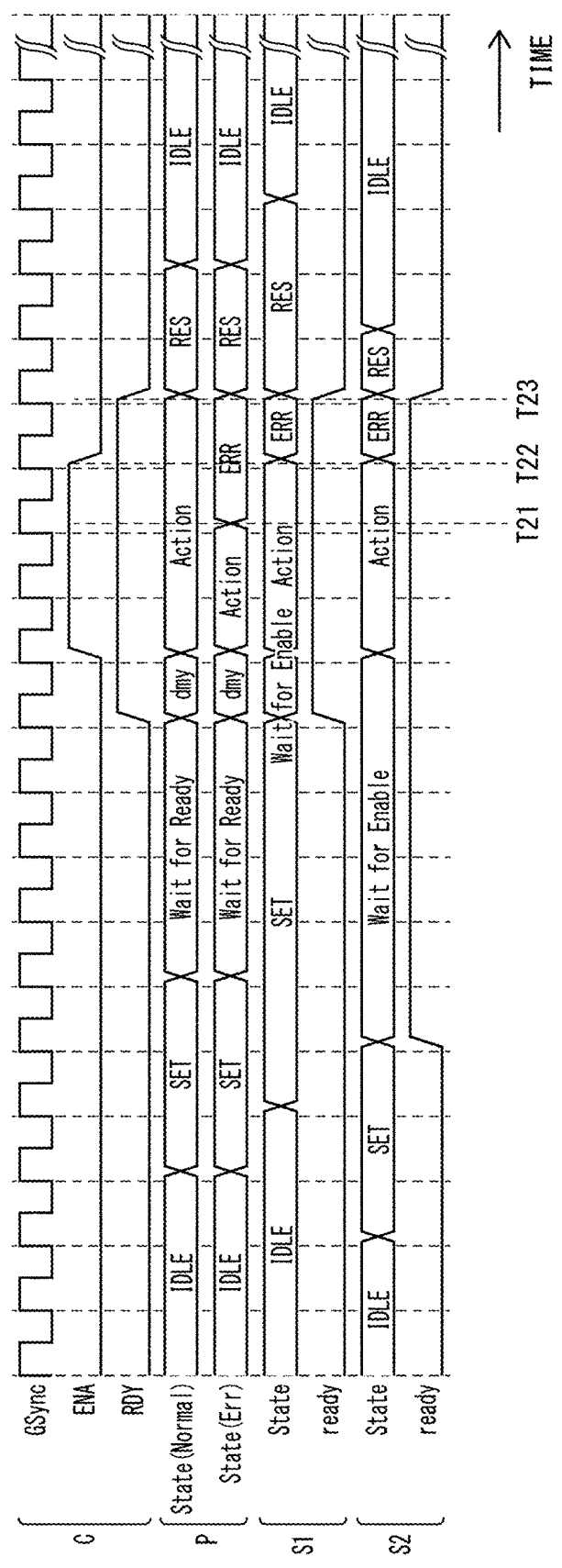
FIG. 3 is a timing chart illustrating an example of operations of a primary unit and secondary units in a case where an abnormality has occurred.

Next, with reference to FIG. 3, another example of operations of the primary unit P and secondary units S1 and S2 will be described. The description with reference to FIG. 2 has discussed an example of operation in a case where the primary unit P and the secondary units S1 and S2 operate normally. The description with reference to FIG. 3 will discuss an example of operation in a case where an abnormality occurs in the primary unit P. Note that, for easy explanation, FIG. 3 illustrates both a state of the primary unit P in normal times and a state of the primary unit P in abnormal times. In FIG. 3, "State (Normal)" represents the state in normal times and "State (Err)!" represents the state in abnormal times.

It is assumed that an abnormality has occurred in the primary unit P at timing T21. The primary unit P which has detected the abnormality turns the ENA signal to low and notifies the secondary units S1 and S2 to start a stopping process for stopping the characteristic test (timing T22). In FIG. 3, "ERR" represents a state in which an abnormality has occurred. Note that the stopping process carried out in abnormal times can be set so as to be started in a case where any one of AD (analog digital), DI (digital input), and Ext meets a condition for stopping.

The secondary units S1 and S2 which have detected the ENA signal being low each proceed to a stopping process and turn the RDY signal low (timing T23). In the stopping process, the step sequencer is carried out until the end with DAC (digital analog converter) and DO (digital out) fixed to settings at the last step (timing T23). The reason why the step sequencer is carried out until the end is to prevent an unexpected error which may otherwise occur when the step sequencer is stopped halfway.

(Example of Operation in Case where Abnormality Occurs in Primary Unit P)

Figure 4:
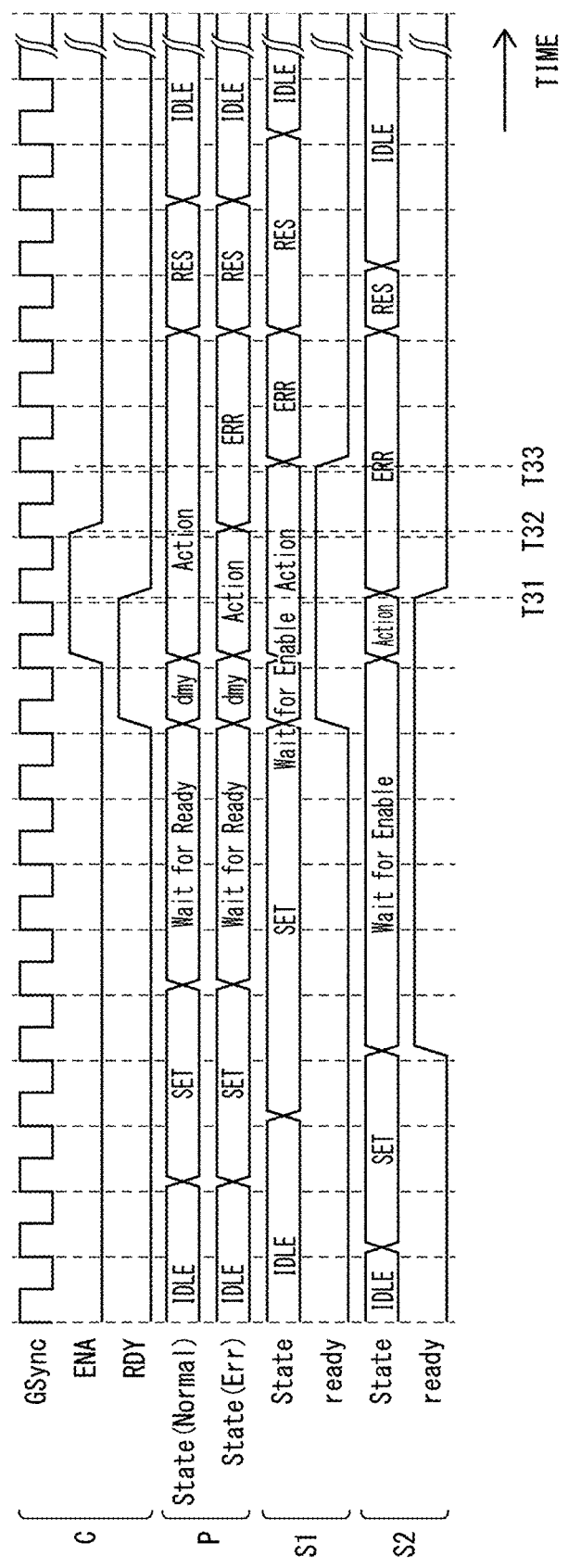
FIG. 4 is a timing chart illustrating another example of operations of a primary unit and secondary units in a case where an abnormality has occurred.

Next, with reference to FIG. 4, another example of operations of the primary unit P and the secondary units S1 and S2 will be described. The description with reference to FIG. 3 has discussed an example of operation in a case where an abnormality occurs in the primary unit P. The description with reference to FIG. 4 will discuss an example of operation in a case where an abnormality occurs in the secondary unit S2 out of the two secondary units. Note that, similarly as FIG. 3, FIG. 4 illustrates both a state of the primary unit P in normal times and a state of the primary unit P in abnormal times. In FIG. 4, "State (Normal)!" represents the state in normal times and "State (Err)" represents the state in abnormal times. Note, however, that in FIG. 4, "State (Err)!" indicates a state in which the stopping process is being carried out not due to an abnormality of the primary unit P itself but due to an abnormality that has occurred in the secondary unit S2.

It is assumed that an abnormality occurs in the secondary unit S2 at a timing T31. The secondary unit S2 which has detected the abnormality turns the RDY signal low and notifies the primary unit P to start a stopping process for stopping the characteristic test (timing T31).

The primary unit P which has detected the RDY signal being low turns the ENA signal low in order to instruct another unit having no abnormality, i.e., the secondary unit S1, to carry out the stopping process (timing T32). The secondary unit S1 that has detected the ENA signal being low starts the stopping process (timing T33). Note that also in a case where an abnormality occurs in the secondary unit S2, the step sequencer is carried out until the end, similarly as in the case where an abnormality has occurred in the primary unit P.

(Example of Operations in Primary Mode (B) and Secondary Mode (B))

The following description will discuss examples of operation of a backplane, that is, examples of operation in the primary mode (B) and the secondary mode (B).

Figure 5:
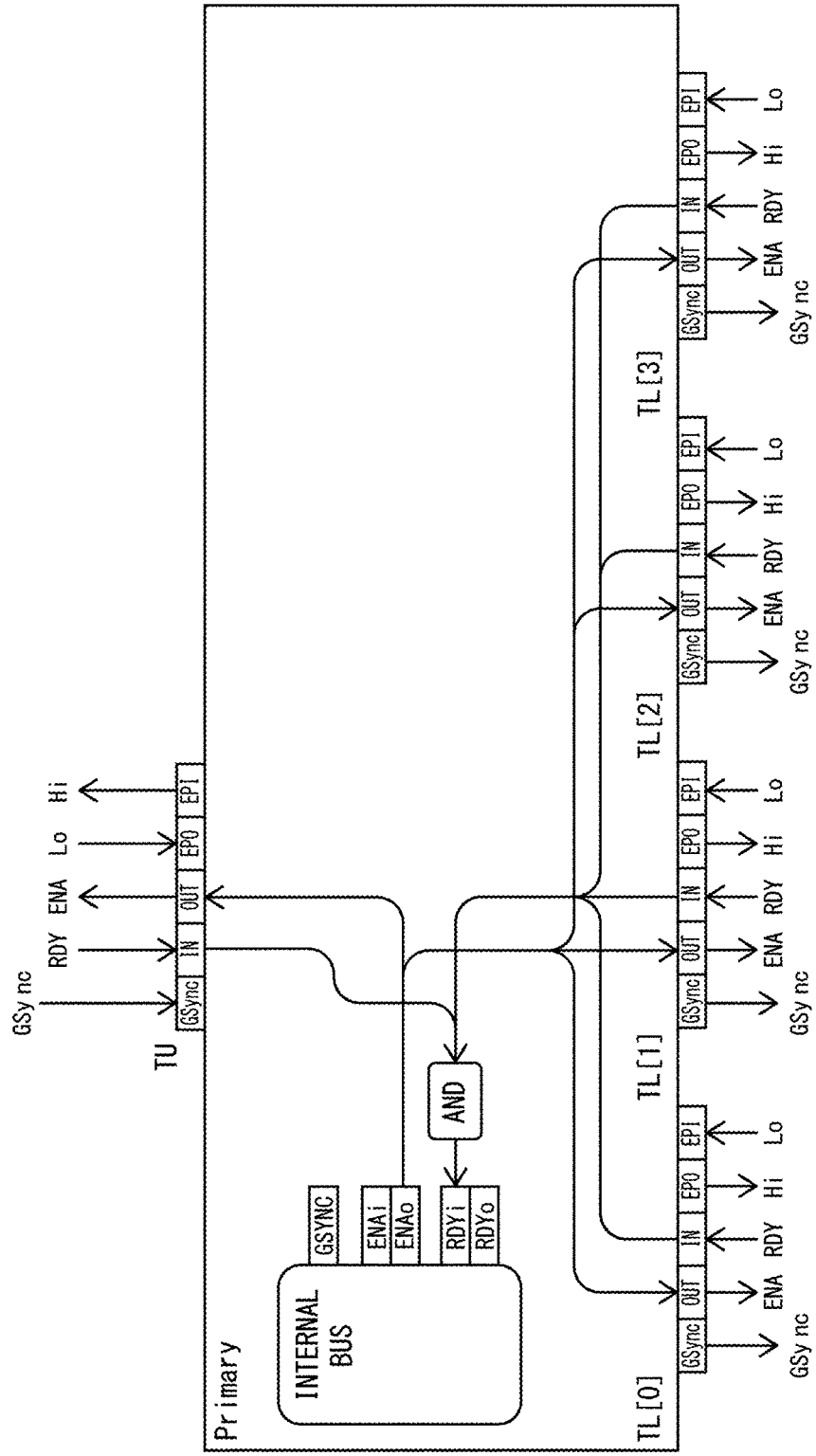
FIG. 5 is a view illustrating flows of signals inputted to a backplane and flows of signals outputted from the backplane.

Referring first to FIG. 5, an example of operation in the primary mode (B) will be described. FIG. 5 is a view illustrating flows of signals inputted to a backplane that operates in the primary mode (B) and flows of signals outputted from the backplane that operates in the primary mode (B).

Under the above-described categorization, the backplane illustrated in FIG. 5 is categorized as (3) a backplane which is a child backplane and to the internal bus of which a primary unit is connected. As such, in terms of FIG. 1, the backplane illustrated in FIG. 5 is any one of the backplanes 20 through 23 and 30 through 33. Among the plurality of units connected to the internal bus of the backplane illustrated in FIG. 5, one is a primary unit and all of the others are secondary units. The backplane illustrated in FIG. 5 is located at a level of hierarchy other than the first level. "TU" in FIG. 5 indicates a ToUpper port. The ToUpper port is connected to an upper backplane. "TL[0]", "TL[1]", "TL[2]", and "TL[3]" in FIG. 5 represent four ToLower ports, each of which is connected to a lower backplane. Since there is only one primary unit across all backplanes, all of the units connected to the upper backplane are secondary units, and all of the units connected to the lower backplanes are also secondary units.

A GSync signal outputted from the upper backplane is inputted to the ToUpper port. The backplane illustrated in FIG. 5 outputs the GSync signal to the lower backplanes through the respective ToLower ports.

An RDY signal outputted from the upper backplane is inputted to the ToUpper port. Further, RDY signals outputted from the lower backplanes are inputted to the ToLower ports. A logical disjunction of the RDY signals is inputted to an input pin RDYi allocated to the internal bus.

When the RDY signal is high, an ENA signal is outputted from an output pin ENAo allocated to the internal bus. The backplane illustrated in FIG. 5 outputs the ENA signal, which has been outputted from the output pin ENAo, to the upper backplane through the ToUpper port. The backplane illustrated in FIG. 5 also outputs the ENA signal, which has been outputted from the output pin ENAo, to the lower units through the ToLower ports.

In FIG. 5, "EPI" (Existence Primary Input) and "EPO" (Existence Primary Output) are signals that indicate a position of the primary unit, i.e., indicates where the primary unit is present in the tree structured connection.

More specifically, when an EPI signal inputted to a port is high, it is indicated that there is a primary unit in a path leading to the port. Further, in a case where an EPI signal inputted to a port is low, it is indicated that there is no primary unit in a path leading to the port.

In a case where an EPO signal outputted through a port is high, it is indicated that there is a primary unit in a path preceding the port. In a case where an EPO signal outputted through a port is low, it is indicated that there is no primary unit in a path preceding the port. The "path preceding the port" means a path located on a side of the port which side is opposite to a side of the port to which side the EPO signal is outputted through the port. Note that an EPI signal and an EPO signal are signals that are generated by each unit, and transmission and reception of the signals are carried out via a backplane.

In FIG. 5, an EPI signal at a low level is inputted to the ToUpper port. This allows the units connected to the internal bus of the backplane illustrated in FIG. 5 to recognize that there is no primary unit in a path leading to the ToUpper port. The backplane illustrated in FIG. 5 outputs an EPO signal at a high level to the upper backplane through the ToUpper port. This allows the units connected to the internal bus of the upper backplane to recognize that there is a primary unit in a path preceding the ToUpper port.

To each ToLower port, an EPI signal at a low level is inputted. This allows the units connected to the internal bus of the backplane illustrated in FIG. 5 to recognize that there is no primary unit in the paths leading to the respective ToLower ports. The backplane illustrated in FIG. 5 outputs an EPO signal at a high level to each lower backplane through the ToLower port. This allows the units connected to the internal bus of the lower backplane to recognize that there is a primary unit in a path preceding the ToLower port.

Figure 6:
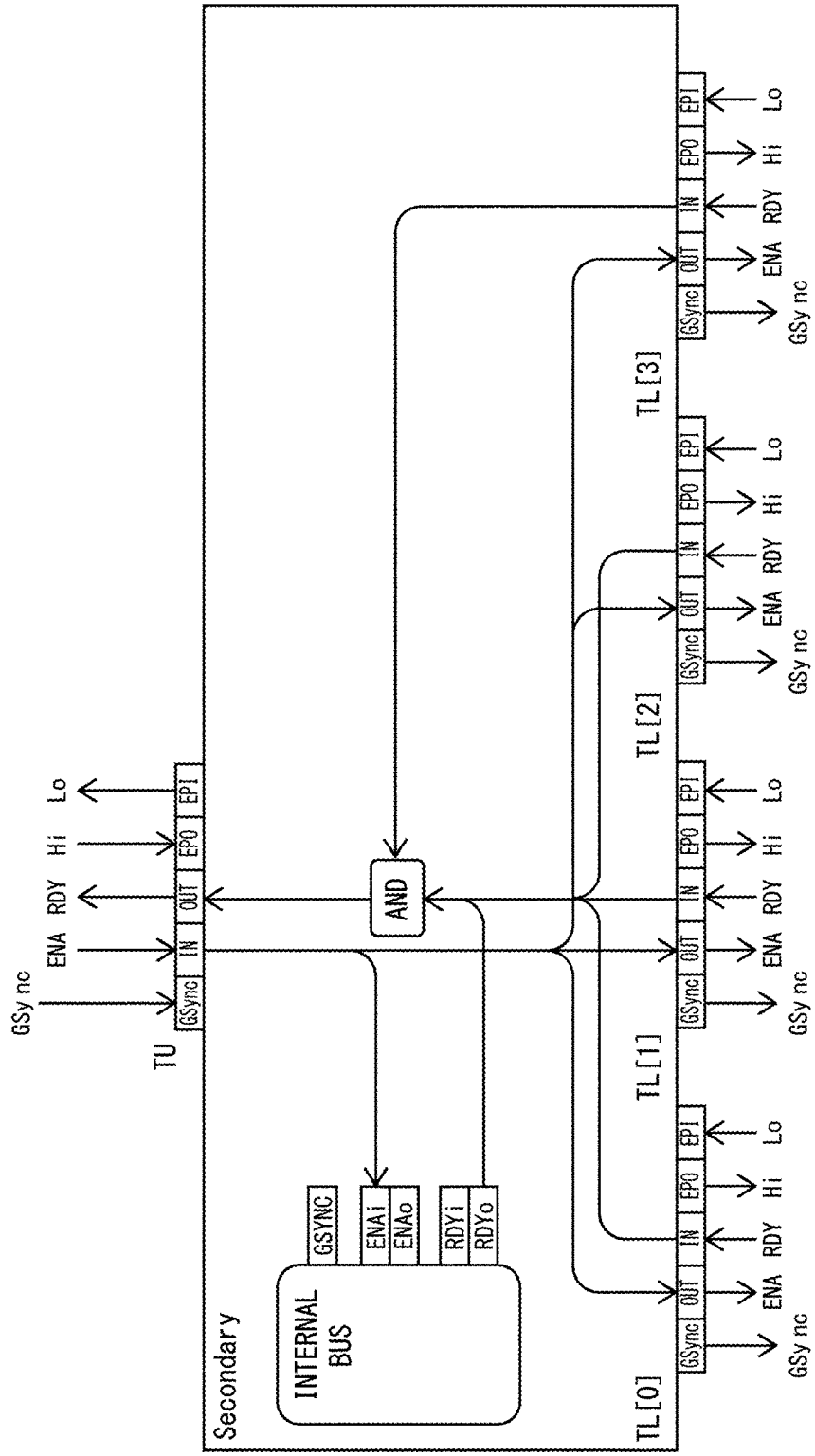
FIG. 6 is a view illustrating flows of signals inputted to a backplane and flows of signals outputted from the backplane.

Next, with reference to FIG. 6, an example of operation in the secondary mode (B) will be described. FIG. 6 is a view illustrating flows of signals inputted to a backplane that operates in the secondary mode (B) and flows of signals outputted from the backplane that operates in the secondary mode (B).

Under the above-described categorization, the backplane illustrated in FIG. 6 is categorized as (4) a backplane which is a child backplane and an internal bus of which is not connected to a primary unit. As such, in terms of FIG. 1, the backplane illustrated in FIG. 6 is any one of the backplanes 20 through 23 and 30 through 33. All of the plurality of units connected to the internal bus of the backplane illustrated in FIG. 6 are secondary units. The backplane illustrated in FIG. 6 is located at a level of hierarchy other than the first level. "TU", "TL[0]", "TL[1]", "TL[2]", and "TL[3]" in FIG. 6 are the same as those in FIG. 5. A primary unit is located at a level above the backplane illustrated in FIG. 6.

A GSync signal outputted from an upper backplane is inputted to the ToUpper port. The backplane illustrated in FIG. 6 outputs the GSync signal to lower units through the ToLower ports.

An ENA signal outputted from the primary unit located somewhere at an upper level is inputted to the ToUpper port. The backplane illustrated in FIG. 6 outputs the ENA signal to the lower units through the ToLower ports. The ENA signal is also inputted to an input pin ENAi allocated to the internal bus.

RDY signals outputted from the lower backplanes are inputted to the ToLower ports. An RDY signal is outputted from an output pin RDYo allocated to the internal bus. The backplane illustrated in FIG. 6 outputs, to the upper backplane through the ToUpper port, a logical disjunction of the RDY signals outputted from the lower backplanes and the RDY signal outputted from the output pin RDYo.

To the ToUpper port, an EPI signal at a high level is inputted. This allows the units connected to the internal bus of the backplane illustrated in FIG. 6 to recognize that there is a primary unit in a path leading to the ToUpper port. The backplane illustrated in FIG. 6 outputs an EPO signal at a low level to the upper backplane through the ToUpper port. This allows the units connected to the internal buses of the upper backplane to recognize that there is no primary unit in a path preceding the ToUpper port.

To each ToLower port, an EPI signal at a low level is inputted. This allows the units connected to the internal bus of the backplane illustrated in FIG. 6 to recognize that there is no primary unit in the path leading to each ToLower port. The backplane illustrated in FIG. 6 outputs an EPO signal at a high level to each lower backplane through the ToLower port. This allows the units connected to the internal bus of the lower backplane to recognize that there is a primary unit in a path preceding the ToLower port.

Figure 7:
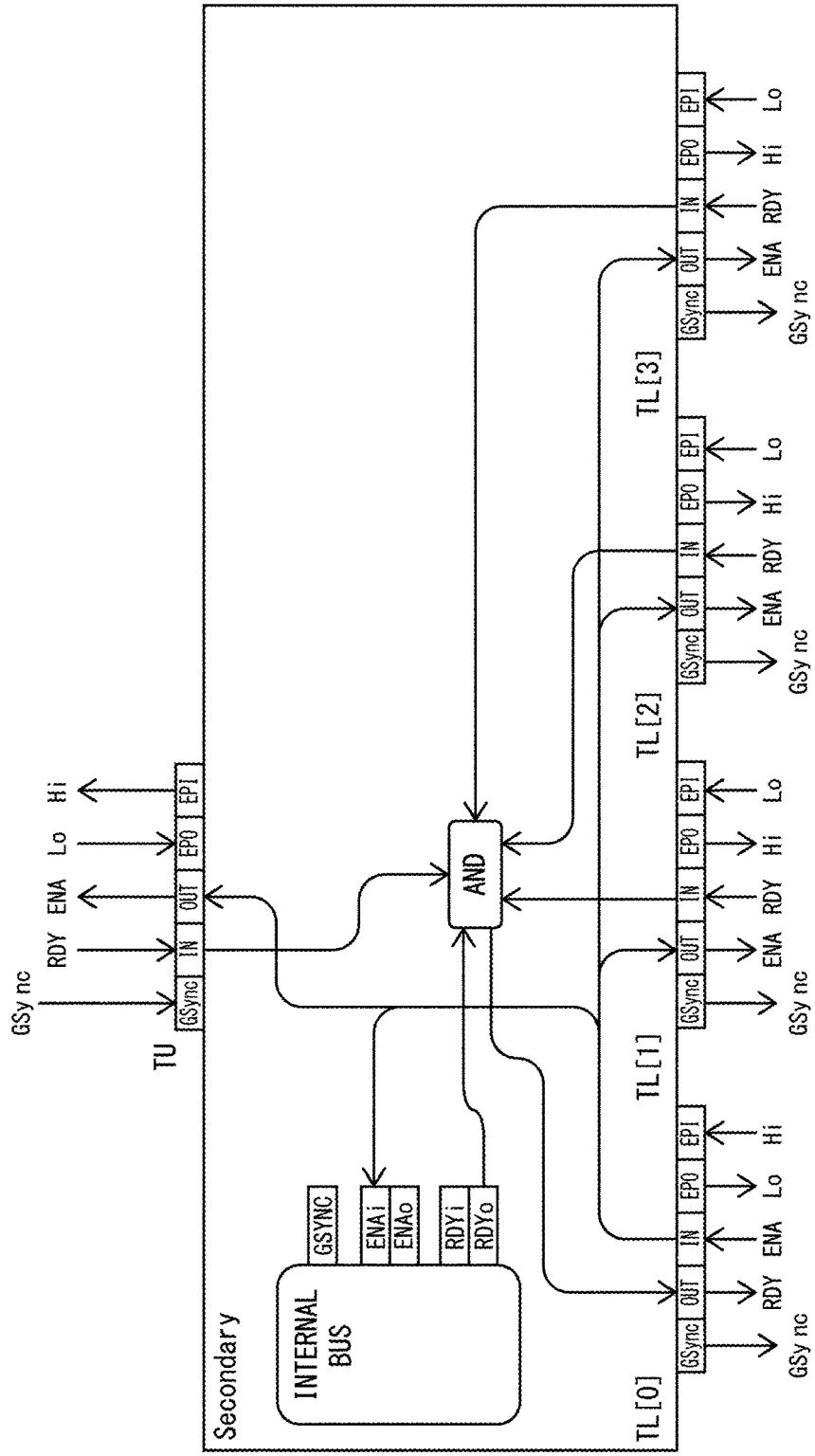
FIG. 7 is a view illustrating flows of signals inputted to a backplane and flows of signals outputted from the backplane.

Next, with reference to FIG. 7, another example of operation in the secondary mode (B) will be described. Similarly as the backplane illustrated in FIG. 6, the backplane illustrated in FIG. 7 is categorized as (4) a backplane which is a child backplane and to the internal bus of which no primary unit is connected. FIG. 7 differs from FIG. 6 in that the primary unit is located at an upper level in FIG. 6 whereas the primary unit is located at a lower level in FIG. 7. Specifically, in FIG. 7, the primary unit is located in a path leading to TL[0]Units present in the path leading to TL[0] include the primary unit and secondary units. Units present in the paths leading to TL[1], TL[2], and TL[3] are all secondary units.

A GSync signal outputted from the upper backplane is inputted to the ToUpper port. The backplane illustrated in FIG. 7 outputs the GSync signal to lower units through the ToLower ports.

An ENA signal outputted from the primary unit located somewhere in the path leading to TL[0] is inputted to TL[0]. The backplane illustrated in FIG. 7 outputs the ENA signal to the upper unit through the ToUpper port. The backplane illustrated in FIG. 7 also outputs the ENA signal through TL[1], TL[2], and TL[3] to lower backplanes. Further, the ENA signal is inputted to an input pin ENAi allocated to the internal bus.

RDY signals outputted from lower backplanes are inputted to TL[1], TL[2], and TL[3]. An RDY signal outputted from the upper backplane is inputted to the ToUpper port. Further, an RDY signal is outputted from an output pin RDYo allocated to the internal bus. The backplane illustrated in FIG. 7 outputs, through TL[0] to the backplane to which the primary unit is connected, a logical disjunction of the RDY signals outputted from the lower backplanes, the RDY signal outputted from the upper backplane, and the RDY signal outputted from the output pin RDYo.

To the ToUpper port, an EPI signal at a low level is inputted. This allows the units connected to the internal bus of the backplane illustrated in FIG. 7 to recognize that there is no primary unit in a path leading to the ToUpper port. The backplane illustrated in FIG. 7 outputs an EPO signal at a high level to the upper backplane through the ToUpper port. This allows the units connected to the internal bus of the upper backplane to recognize that there is a primary unit in a path preceding the ToUpper port.

To TL[0], an EPI signal at a high level is inputted. This allows the units connected to the internal bus of the backplane illustrated in FIG. 7 to recognize that there is a primary unit in the path leading to TL[0] To TL[1], TL[2], and TL[3], an EPI signal at a low level is inputted. This allows the units connected to the internal bus of the backplane illustrated in FIG. 7 to recognize that there is no primary unit in any of the paths leading to TL[1], TL[2], and TL[3].

The backplane illustrated in FIG. 7 outputs an EPO signal at a low level through TL[0] to the lower backplane. This allows the units connected to the internal bus of the lower backplane present in the path leading to TL[0] to recognize that there is no primary unit in a path preceding TL[0]. The backplane illustrated in FIG. 7 also outputs an EPO signal at a high level through TL[1], TL[2], and TL[3] to the lower backplanes. This allows the units connected to the internal buses of the lower backplanes that are present in the paths leading to TL[1], TL[2], and TL[3] to recognize that there is a primary unit in the paths preceding TL[1], TL[2], and TL[3].

Note that in a case where a backplane functions as a root backplane, the backplane generates a GSync signal and outputs the generated GSync signal to another child backplane through GSYNC allocated to the internal bus of the backplane and GSYNC of the ToLower port. The direction in which a GSync signal is transmitted is fixed to an upper-to-lower direction regardless of the operation mode of the backplane.

(Effects)

As described above, the test system 100 in accordance with the present embodiment provides the following effects.

The test system 100 includes the plurality of backplanes 10, 20 through 23, and 30 through 33, and the integrated controller 1. To each of the backplanes, the plurality of units 10g through 10j, 20g through 20j, . . . used for a characteristic test of a device are connected. Note, however, that the number of units connected to each backplane does not necessarily have to be more than one. It is sufficient that at least one unit is connected to each backplane. The backplanes are connected to each other in a tree structure. That is, the units connected to the backplanes are also connected in a tree structure. In a case where a plurality of units are daisy-chained as in the conventional technologies, the signal delay increases in proportion to the number of units. In contrast, as in the present embodiment, in a case where a plurality of units are connected to one another in a tree structure, it is possible to reduce an increase in signal delay. Specifically, when the number of units is n, the signal delay increases by O(n) in a daisy-chain, whereas the signal delay increases by only O(log n) in a tree structure. O represents a predetermined function. For example, consider a case where five units are connected. In a case where the units are connected in a tree structure such as the first and second levels of hierarchy illustrated in FIG. 1, an increase in signal delay is reduced to one fourth of an increase in signal delay in a case where the units are connected by daisy-chaining. Note that this example assumes a case where one unit is connected to one backplane. According to the present embodiment, it becomes possible to improve accuracy of synchronization between the units, and thus it is possible to efficiently carry out the characteristic test.

In accordance with the type of the characteristic test, the integrated controller 1 determines, from among the units connected to the plurality of backplanes, a primary unit that controls operations of the other units (secondary units). This makes it possible to change the positions of the primary unit and the secondary units for each type of the characteristic test. In a tree structure, the directions of signals are automatically reconstructed. As such, a desired characteristic test can be carried out simply by specifying the primary unit. This allows the load of management with use of software to be reduced.

The units connected to the plurality of backplanes each transmit, to another unit, a signal indicative of a position of the primary unit. Since the backplanes are connected along the depth of the tree structure, the secondary units must transmit the signal in a direction opposite to that of the primary unit. Each unit recognizes whether the unit itself is operating in the primary mode or the secondary mode. However, the unit is not aware of the modes in which the other units are operating. As such, in the present embodiment, a configuration is employed in which an EPI signal and an EPO signal are used to allow each unit to recognize where the primary unit is located. This allows the secondary units to transmit an ENA signal in a direction opposite to a direction in which the primary unit is located and to transmit an RDY signal in a direction in which the primary unit is located. This allows a handshake signal to be transmitted in all of the backplanes in a bucket-brigade manner.

After a predetermined time has passed since the primary unit received from another unit a signal indicating that the another unit is ready to operate, the primary unit transmits, to the another unit, a signal that permits the another unit to operate. This makes it possible to improve accuracy of synchronization between the units. Note that the "signal indicating that" the another unit "is ready to operate" corresponds to the RDY signal. The "signal that permits" the another unit "to operate" corresponds to the ENA signal.

A backplane located at an uppermost level in the tree structure generates a synchronization signal (GSync signal) for synchronizing units with each other, and transmits the generated synchronization signal to other backplanes. This makes it possible to carry out a synchronization process utilizing the characteristics of the tree structure.

The present disclosure can be suitably used for a characteristic test of a semiconductor device.

[Software Implementation Example]

Functions of the integrated controller 1 can be realized by a program for causing a computer to function as the integrated controller 1.

In this case, the integrated controller 1 includes, as hardware for executing the program, a computer including at least one device (e.g., a processor) and at least one storage device (e.g., a memory). The functions described in the above embodiments are realized by the program being executed by the computer.

The program may be recorded in one or more non-transitory computer-readable recording media. The recording media may be included in the integrated controller 1 or need not be included in the integrated controller 1. In the latter case, the program may be supplied to the integrated controller 1 via any wired or wireless transmission medium.

The present disclosure is not limited to the foregoing embodiments, but can be altered variously by a skilled person in the art within the scope of the claims.

For example, clock delay correction may be introduced into the test system 100.

[Supplementary Note]

The present disclosure can be expressed as follows.

A test system in accordance with Aspect 1 of the present disclosure is configured such that the test system includes: a plurality of backplanes to which units used in a characteristic test of a device are connected such that at least one unit is connected to each of the plurality of backplanes; and an integrated controller that controls the at least one unit, the plurality of backplanes being connected to each other in a tree structure.

In Aspect 2 of the present disclosure, the test system in accordance with Aspect 1 may be configured such that the integrated controller determines, in accordance with a type of the characteristic test, a primary unit from among the units connected to the plurality of backplanes, the primary unit controlling an operation of another unit.

In Aspect 3 of the present disclosure, the test system in accordance with Aspect 2 may be configured such that the units connected to the plurality of backplanes each transmit, to another unit, a signal indicative of a position of the primary unit.

In Aspect 4 of the present disclosure, the test system in accordance with Aspect 2 may be configured such that after a lapse of a predetermined time since the primary unit received from the another unit a signal indicating that the another unit is ready to operate, the primary unit transmits, to the another unit, a signal that permits the another unit to operate.

In Aspect 5 of the present disclosure, the test system in accordance with any one of Aspects 1 through 4 may be configured such that a backplane located at an uppermost level in the tree structure generates a synchronization signal for synchronizing the units with each other and transmits the synchronization signal generated to another backplane.

In Aspect 6 of the present disclosure, the test system in accordance with any one of Aspects 1 through 5 may be configured such that the device is a semiconductor device.

The invention claimed is:

1. A test system, comprising:
a plurality of backplanes; and
an integrated controller, wherein a plurality of units are connected to each of the plurality of backplanes;
the integrated controller controls the plurality of units;
the plurality of units are used in a characteristic test of a device;
the plurality of backplanes being connected to each other in a tree structure, the tree structure is a structure in which, starting from a single root node, a plurality of child nodes are branched successively as a hierarchy deepens;
the plurality of units consist of one primary unit and a plurality of secondary units;
the integrated controller determines, in accordance with a type of the characteristic test, the primary unit that controls the operation of the secondary units from among the plurality of units; and
the secondary unit transmits a signal indicative of a position of the primary unit to the other secondary units.

2. The test system according to claim 1, wherein after a lapse of a predetermined time since the primary unit received from the secondary unit a signal indicating that the secondary unit is ready to operate, the primary unit transmits, to the secondary unit, a signal that permits the secondary unit to operate.

3. The test system according to claim 1, wherein a backplane located at an uppermost level in the tree structure generates a synchronization signal for synchronizing the units with each other and transmits the synchronization signal generated to another backplane.

4. The test system according to claim 1, wherein the device is a semiconductor device.

5. The test system according to claim 1, wherein the plurality of units are inserted into slots of the backplane, and the integrated controller determines the one primary unit from among all the units.

* * * * *